United States Patent
Matsubara et al.

(10) Patent No.: US 9,831,161 B2
(45) Date of Patent: Nov. 28, 2017

(54) SUPPORT TERMINAL INTEGRAL WITH DIE PAD IN SEMICONDUCTOR PACKAGE

(71) Applicant: ROHM CO., LTD., Kyoto-shi, Kyoto (JP)

(72) Inventors: Hiroaki Matsubara, Kyoto (JP); Yasumasa Kasuya, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/095,848

(22) Filed: Apr. 11, 2016

(65) Prior Publication Data

US 2016/0307854 A1 Oct. 20, 2016

(30) Foreign Application Priority Data

Apr. 16, 2015 (JP) .................. 2015-084132

(51) Int. Cl.
| | |
|---|---|
| *H01L 23/495* | (2006.01) |
| *H01L 21/00* | (2006.01) |
| *H01L 21/56* | (2006.01) |
| *H01L 23/00* | (2006.01) |

(Continued)

(52) U.S. Cl.
CPC ........ *H01L 23/49575* (2013.01); *H01L 21/48* (2013.01); *H01L 21/56* (2013.01); *H01L 23/49503* (2013.01); *H01L 23/49531* (2013.01); *H01L 24/49* (2013.01); *H01L 24/85* (2013.01); *H01L 23/3107* (2013.01); *H01L 23/49582* (2013.01); *H01L 2224/78301* (2013.01); *H01L 2924/00014* (2013.01)

(58) Field of Classification Search
CPC ......... H01L 23/49575; H01L 23/49503; H01L 23/49531; H01L 24/85; H01L 23/3017; H01L 24/49; H01L 21/56
See application file for complete search history.

(56) References Cited

U.S. PATENT DOCUMENTS

| | | | |
|---|---|---|---|
| 7,064,442 B1* | 6/2006 | Lane ..................... | H01L 23/495 257/676 |
| 8,782,503 B2 | 7/2014 | Kaeriyama | |
| 9,397,037 B2* | 7/2016 | Yasunaga ................ | H01L 23/52 |

(Continued)

FOREIGN PATENT DOCUMENTS

| | | |
|---|---|---|
| JP | 2000-68437 A | 3/2000 |
| JP | 2013-51547 A | 3/2013 |

*Primary Examiner* — Alonzo Chambliss
(74) *Attorney, Agent, or Firm* — Hamre, Schumann, Mueller & Larson, P.C.

(57) ABSTRACT

A semiconductor device includes a semiconductor element circuit, a conductive support and a sealing resin. The conductive support includes a die pad, first terminals spaced in a first direction, second terminals spaced in the first direction and opposite to the first terminals in a second direction perpendicular to the first direction, and a support terminal connected to the die pad. The sealing resin encapsulates portions of the first and second terminals, a portion of the support terminal, the semiconductor element circuit and the die pad. The sealing resin has two first side surfaces spaced apart in the second direction and two second side surfaces spaced apart in the first direction. The first terminals and second terminals are exposed from the first side surfaces, while none of the elements of the conductive support is exposed from the second side surfaces.

31 Claims, 13 Drawing Sheets

(51) Int. Cl.
*H01L 21/48* (2006.01)
*H01L 23/31* (2006.01)

(56) References Cited

U.S. PATENT DOCUMENTS

2013/0154071 A1* 6/2013 Haigh ............... H01L 23/49503
　　　　　　　　　　　　　　　　　　　　　　257/676
2014/0374890 A1* 12/2014 Yamashita ........ H01L 23/49575
　　　　　　　　　　　　　　　　　　　　　　257/670

* cited by examiner

SUPPORT TERMINAL INTEGRAL WITH DIE PAD IN SEMICONDUCTOR PACKAGE

BACKGROUND OF THE INVENTION

1. Field of the Invention

The present invention relates to semiconductor devices. In particular, the present invention relates to a semiconductor device that includes, in a single package, an insulating element or circuit in addition to a plurality of semiconductor elements, where the insulating element carries out signal transmission between the semiconductor elements 2. Description of the Related Art Inverters are used in electric vehicles (including hybrid vehicles) and home appliances for example, and these inverters may incorporate a semiconductor device provided with an insulating element or circuit. Specifically, an inverter used for an electric vehicle may include power semiconductors (such as insulated gate bipolar transistors (IGBTs) and metal oxide semiconductor field effect transistors (MOSFETs)) in addition to a semiconductor device of the above-mentioned type. Such a semiconductor device includes a control element, an insulating element, and a drive element. The inverter supplies a control signal received from an engine control unit (ECU) to the control element of the semiconductor device. The control element converts the control signal into a pulse width modulation (PWM) control signal and transmits the resulting signal to the drive element via the insulating element. According to the PWM control signal, the drive element switches a plurality of (six, for example) IGBTs with a desired timing. Through the switching of the six IGBTs with a desired timing, direct current (DC) power supplied from an on-vehicle battery is converted into three-phase alternating current (AC) power, which is suitable for the motor driving.

In the semiconductor device, the control element operates at a low source voltage (about 5 volts), while the drive element operates at a high source voltage (about 600 volts or higher). Therefore, a PWM control signal (electric signal) from the control element to the drive element needs to be transmitted via the insulating element. A conventional example of the insulating element is a photocoupler. A photocoupler includes a light emitter, such as a light emitting diode (LED), and a light receiver, such as a phototransistor. An electric signal received at the light emitter is converted into an optical signal by the light emitter, and the resulting optical signal is received by the light receiver and converted back into an electric signal. In this way, the electric signal is transmitted. Unfortunately, a semiconductor device formed by mounting a photocoupler as an insulating element, a control element, and a drive element all within a single package tends to be large. In addition, a photocoupler as mentioned above may not be suitable for high-speed switching of IGBTs due to the delay in conversion between an electric signal and an optical signal, which occurs as the frequency of the electric signal is higher.

In view of the above, more and more semiconductor devices include insulating elements with coupled inductors. An inductor-coupled insulating element transmits an electric signal through inductive coupling of two inductors (coils), rather than via electric connection. Specifically, one of the coils converts an electric signal into a magnetic field, and the other coil converts the magnetic field back into an electric signal. This achieves transmission of the electric signal without electric connection. Unlike photocouplers, inductor-coupled insulating elements are suitable for producing compact semiconductor devices and involve little or no delay in transmission of a high-frequency electric signal, which is an advantageous characteristic for high-speed switching of IGBTs. A semiconductor device disclosed in JP-A-2013-51547 includes a semiconductor element having a send circuit, an inductor-coupled insulating element, and a drive element (gate driver integrated circuit) having a receive circuit within a single package.

However, simply providing a semiconductor device with an insulating element may not be sufficient when two semiconductor elements, such as a control element and a drive element, that receive source voltages of significantly different potentials are mounted in the single package. Such a semiconductor device is required to further improve the dielectric strength. In an example of a small outline package (SOP) type, a semiconductor device preferable to further improve the dielectric strength has a sufficient distance separating the terminals exposed from one side surface of the sealing resin from the terminals exposed from the other side surface, with semiconductor elements including a drive element located in between. To further improve the dielectric strength, it is preferable that the terminals are the only portions of a lead frame that are exposed from the sealing resin. The need to further improve dielectric strength increases with increase in the source voltage supplied to a motor controlled by the inverter.

For example, JP-A-2000-68437 discloses a conventional SOP semiconductor device. In the production of the disclosed semiconductor device, a portion of a lead frame called an island support is used to support to an island portion (die pad), which is a portion for mounting semiconductor elements. The island support extends in a direction perpendicular to the extending direction of the terminals and has one end connected to the island portion and another end connected to the peripheral portion of the lead frame. Once the sealing resin is formed, the island portion is supported by the sealing resin and the support by the island support is no longer necessary. Therefore, the island support is cut off from the lead frame when the semiconductor device is cutoff from the lead frame. As a result, a cut surface of the island support is exposed on the side surface of the sealing resin. Since the cur surface of the island support is part of the lead frame, the semiconductor device having such a structure may fail to meet the need to further improve the dielectric strength.

SUMMARY OF THE INVENTION

In view of the circumstances described above, the present invention aims to provide a semiconductor device having a configuration to further improve its dielectric strength.

According to an aspect of the present invention, there is provided a semiconductor device that includes: a semiconductor element circuit; a conductive support provided with a die pad on which the semiconductor element circuit is mounted, first terminals mutually spaced apart in a first direction, second terminals mutually spaced apart in the first direction and disposed opposite to the first terminals in a second direction (perpendicular to the first direction) with respect to the semiconductor element circuit, and a support terminal formed integral with the die pad; and a sealing resin that partially covers the first terminals, the second terminals and the support terminal, while also covering the semiconductor element circuit and the die pad. The sealing resin has a pair of first side surfaces spaced apart in the second direction and a pair of second side surfaces spaced apart in the first direction. The first terminals and the second terminals are exposed from the pair of first side surfaces, while the conductive support is not exposed from any one of the second side surfaces.

According to the aspect of the present invention described above, the plurality of first terminals and the plurality of second terminal are exposed from a different one of the pair of side surfaces of the sealing resin. The die pad, the first terminals, the second terminals, and the support terminal included in the semiconductor device are all components of the conductive support. The conductive support has no components (such as an island support) exposed from the second side surfaces of the sealing resin. This configuration ensures that no metal components of the conductive support not encapsulated by the sealing resin are located near the second terminals for receiving a higher voltage than the first terminals. This configuration is therefore effective to further improve the dielectric strength.

Other features and advantages of the present invention will become apparent from the following detailed description with reference to the accompanying drawings.

DETAILED DESCRIPTION OF THE EMBODIMENTS

Embodiments of the present invention will be described below with reference to the accompanying drawings.

First Embodiment

With reference to FIGS. 1 to 12, the following describes a semiconductor device A1 according to a first embodiment of the present invention. For convenience, the vertical direction of the plan views is defined as a first direction X, and the horizontal direction, which is perpendicular to the first direction X, is defined as a second direction Y. The first direction X and the second direction Y are both within a plane perpendicular to the thickness direction of the semiconductor device A1.

Figure 1:
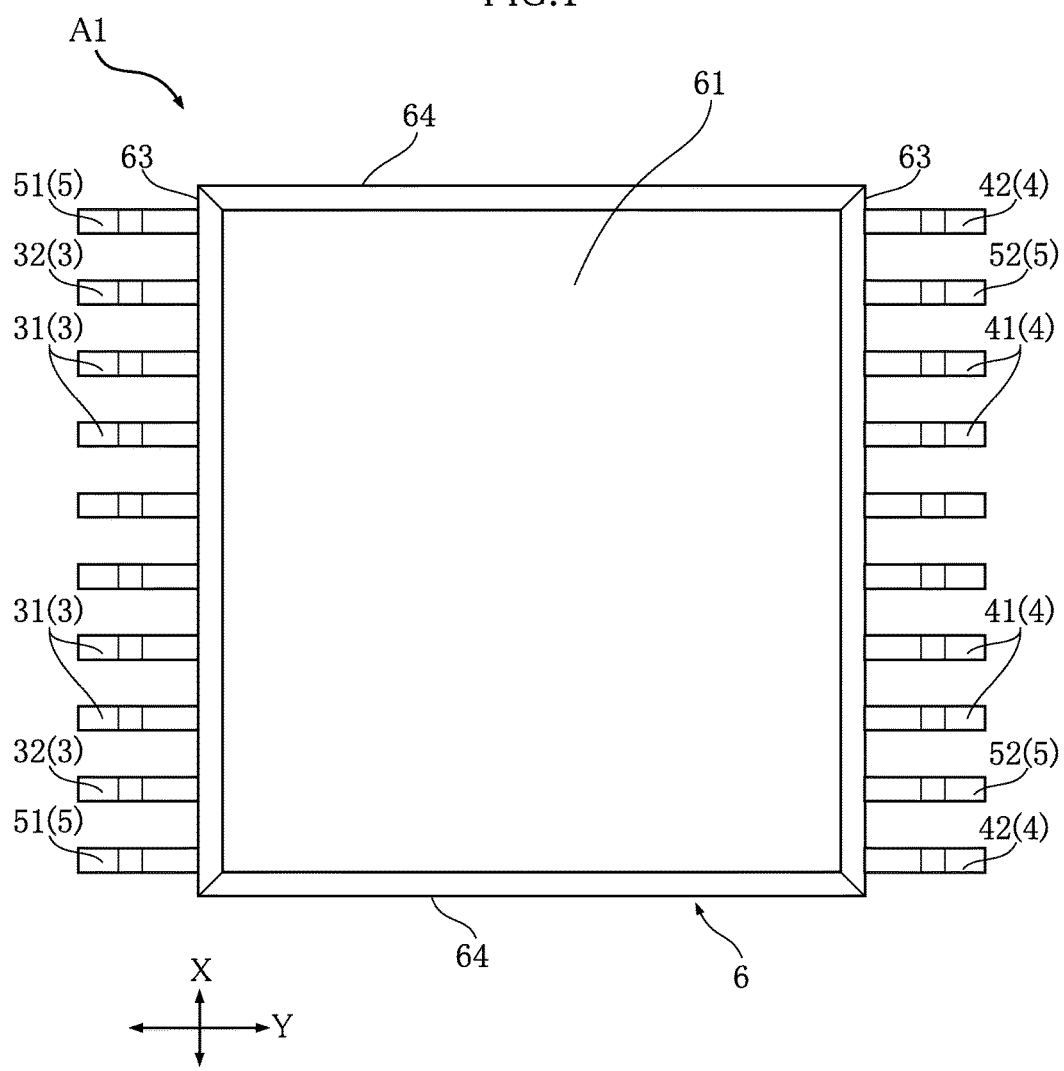
FIG. 1 is a plan view of a semiconductor device according to a first embodiment of the present invention.
Figure 2:
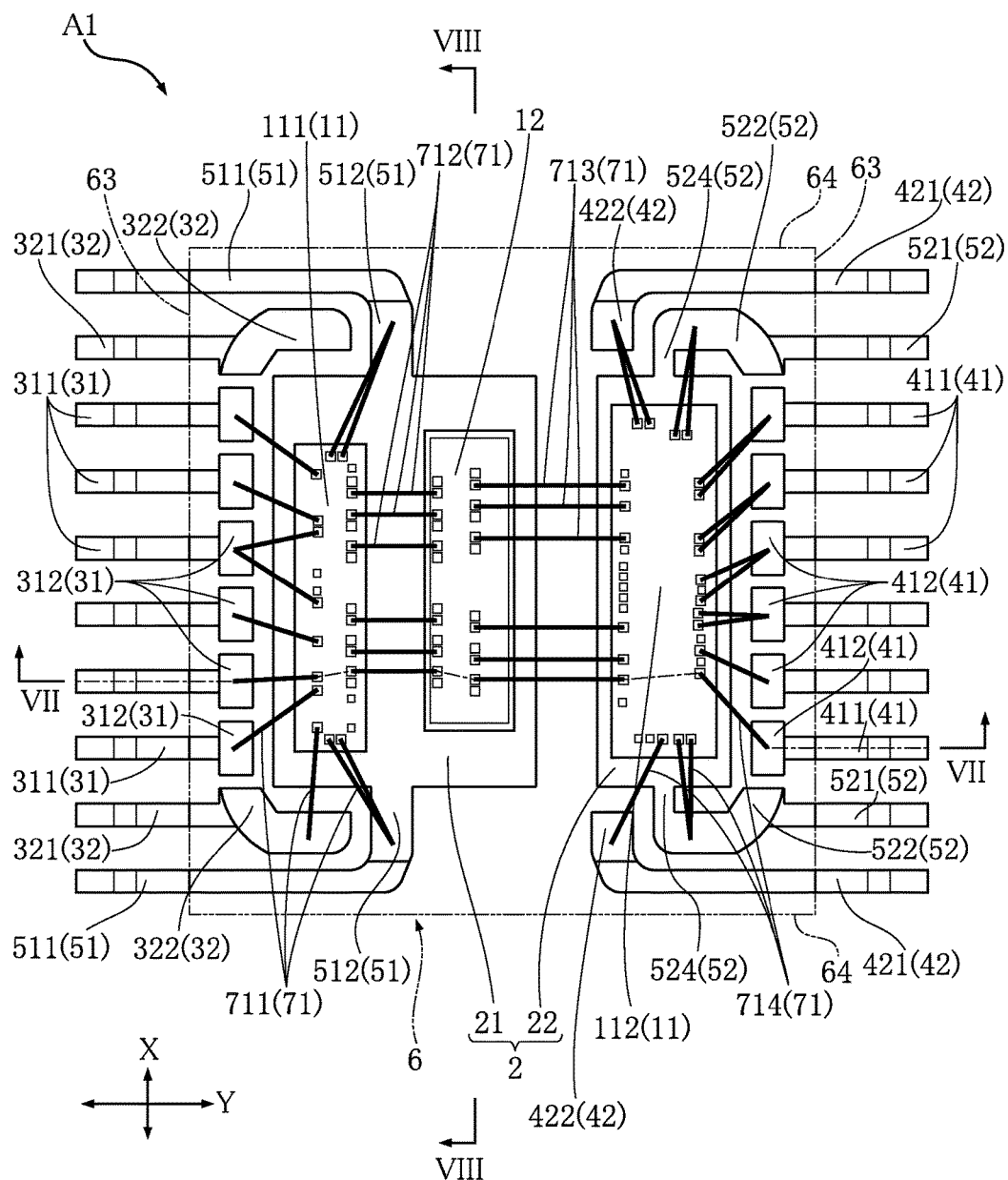
FIG. 2 is a plan view of the semiconductor device shown in FIG. 1 (with a sealing resin omitted).
Figure 3:
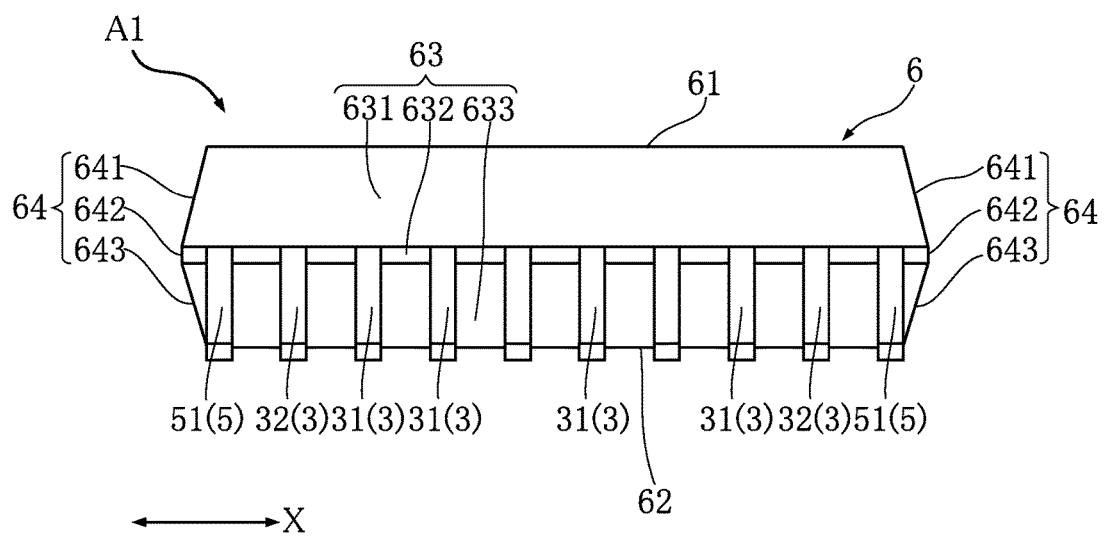
FIG. 3 is a left-side view of the semiconductor device shown in FIG. 1.
Figure 4:
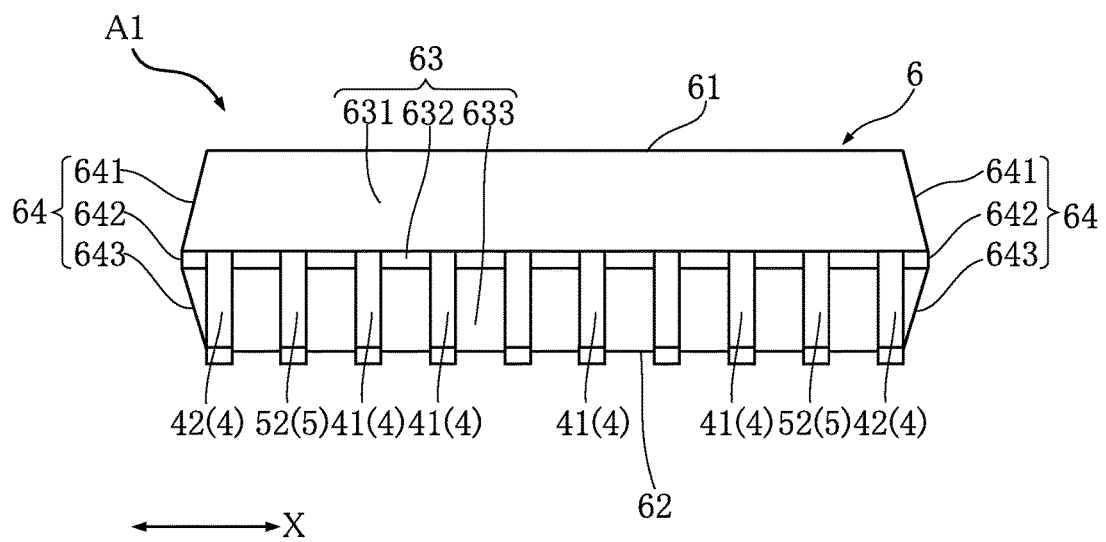
FIG. 4 is a right-side view of the semiconductor device shown in FIG. 1.
Figure 5:
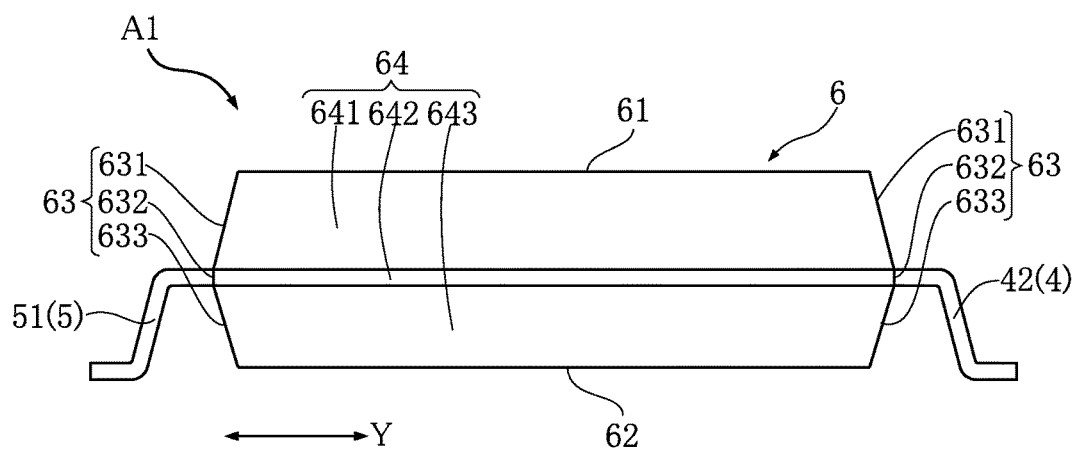
FIG. 5 is a front view of the semiconductor device shown in FIG. 1.
Figure 6:
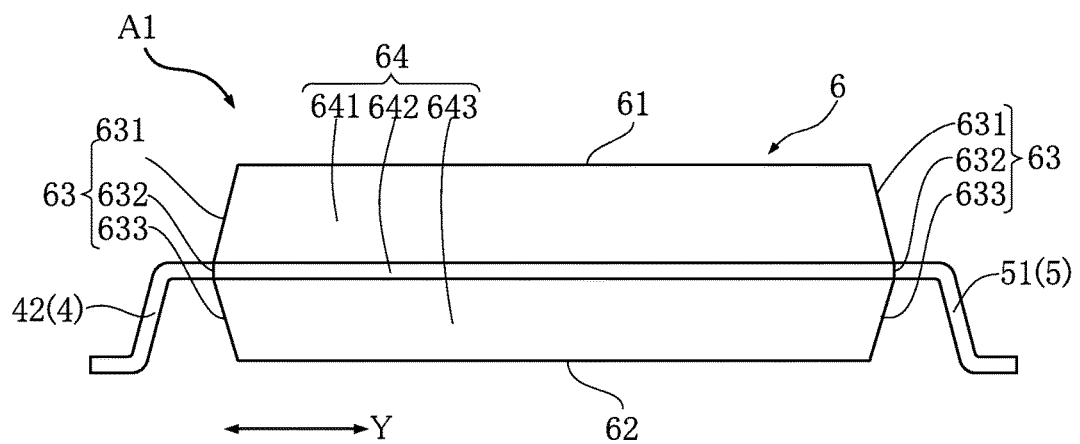
FIG. 6 is a rear view of the semiconductor device shown in FIG. 1.
Figure 7:
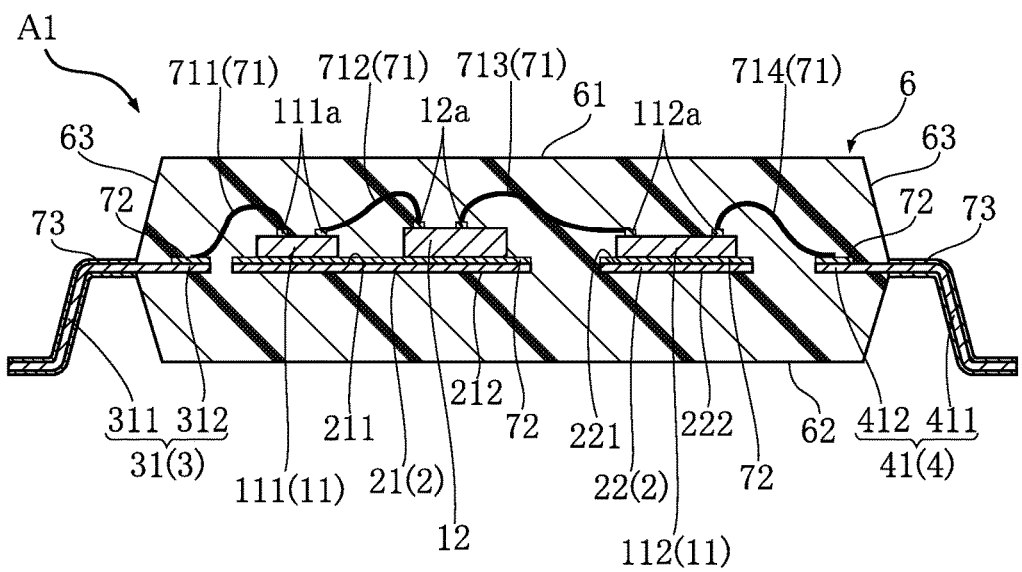
FIG. 7 is a sectional view along line VII-VII of FIG. 2.
Figure 8:
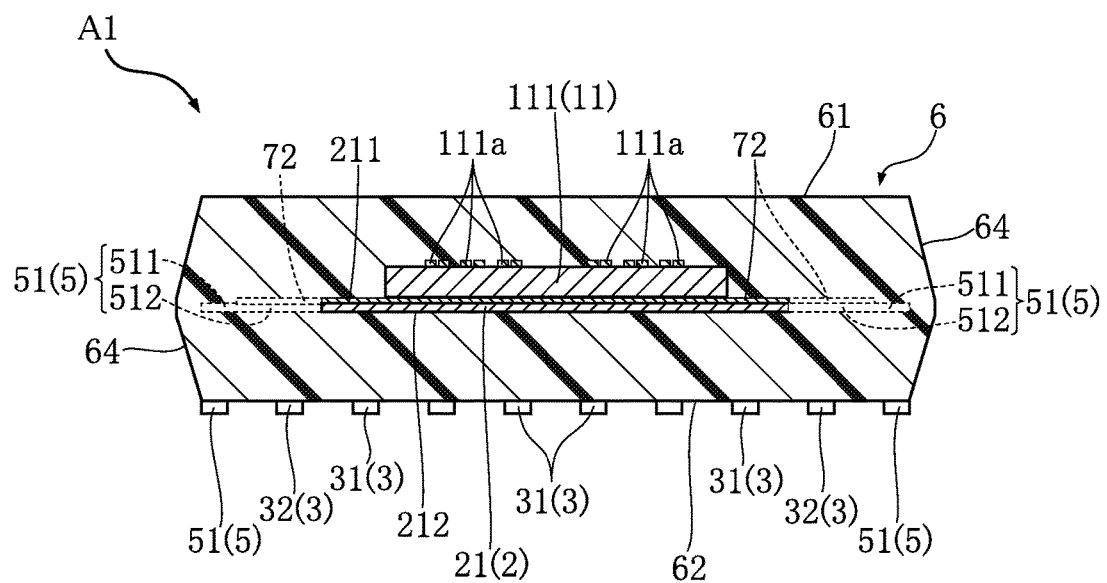
FIG. 8 is a sectional view along line VIII-VIII of FIG. 2.

FIG. 1 is a plan view of the semiconductor device A1. FIG. 2 is a plan view similar to FIG. 1, except that a sealing resin 6, which will be described later, is omitted for clarity. FIG. 3 is a left-side view of the semiconductor device A1. FIG. 4 is a right-side view of the semiconductor device A1. FIG. 5 is a front view of the semiconductor device A1. FIG. 6 is a rear view of the semiconductor device A1. FIG. 7 is a sectional view along line VII-VII (long and short dashed lines) of FIG. 2. FIG. 8 is a sectional view along line VIII-VIII of FIG. 2. In FIG. 2, the sealing resin 6 is omitted and indicated only by imaginary lines (dash-double-dot lines). In FIGS. 7 and 8, the sealing resin 6 is illustrated.

The semiconductor device A1 shown in these figures is of an SOP package type and surface mountable on a circuit board of an inverter of, for example, an electric vehicle or hybrid vehicle. The semiconductor device A1 according to the present embodiment includes semiconductor elements 11, an insulating element 12, a conductive support, the sealing resin 6, bonding wires 71, internal plating 72, and external plating 73. The semiconductor device A1 according to the present embodiment is rectangular in plan view.

The semiconductor elements 11 and the insulating element 12 are used for the semiconductor device A1 to operate. The semiconductor elements 11 include a control element ill and a drive element 112. The control element 111 includes a circuit for converting a control signal input from an ECU into a PWM control signal, a send circuit for sending the PWM control signal to the drive element 112, and a receive circuit for receiving an electric signal from the drive element 112. The drive element 112 includes a receive circuit for receiving a PWM control signal from the control element 111, a circuit (gate driver) for switching a power semiconductor element such as an IGBT based on the PWM signal, and a send circuit for transmitting an electric signal to the control element 111. Examples of electric signals transmitted to the control element 111 include an output signal of a temperature sensor, which may be disposed near the motor.

The insulating element 12 transmits electric signals, including a PWM control signal, without an electrical connection. The insulating element 12 is provided because the drive element 112 requires a higher voltage than the control element 111 and thus a high potential difference is created between the drive element 112 and the control element 111. In a specific example of an inverter for an electric vehicle or hybrid vehicle, the source voltage supplied to the control element 111 is about 5 V, while the source voltage supplied to the drive element 112 is about 600 V or higher. In the present embodiment, the insulating element 12 is an inductor-coupled insulating element, which uses inductive coupling of two inductors (coils) to carry out non-contact transmission of electric signals. The insulating element 12 has a substrate made of silicon (Si). The inductors made of copper (Cu) are mounted on the substrate. The inductors include a send inductor and a receive inductor that are stacked in the thickness direction of the insulating element 12 so as to have a dielectric layer in between. The dielectric layer is made of, e.g., silicon dioxide ($SiO_2$) and electrically isolates the send inductor from the receive inductor.

As shown in FIG. 2, the insulating element 12 is located between the control element 111 and the drive element 112 in the second direction Y. In the present embodiment, the control element ill, the drive element 112, and the insulating element each have a rectangular shape elongated in the first direction X in plan view. The control element 111 and the insulating element 12 are mounted on a first die pad 21, which is one of die pads 2 described later. The drive element 112 is mounted on a second die pad 22, which is another one of the die pads 2. A plurality of pads 111a are formed on the upper surface of the control element 111 (also shown in FIG. 7). Similarly, a plurality of 112a are formed on the upper surface of the drive element 112 (also shown in FIG. 7), whereas a plurality of pads 12a are formed on the upper surface of the insulating element 12 (also shown in FIG. 7).

The conductive support is for mounting the semiconductor elements 11 and the insulating element 12 and also for providing a conduction path among the semiconductor elements 11, the insulating element 12, and the circuit board of an inverter. The conductive support may be made of an alloy containing Cu. The conductive support is constituted by a lead frame 81, which will be described later. The conductive support includes the die pads 2, a plurality of first terminals 3, a plurality of second terminals 4, and a plurality of support terminals 5.

The die pads 2 are for mounting the semiconductor elements 11 and the insulating element 12 thereon. The diepads 2 includes the first die pad 21 and the second die pad 22. As shown in FIG. 2, the first die pad 21 is spaced apart from the second die pad 22 in the second direction Y. In the present embodiment, the first die pad 21 has a larger area than the second die pad 22. In the present embodiment, in addition, the first die pad 21 and the second die pad 22 each have a rectangular shape elongated in the first direction X in plan view. As shown in FIGS. 7 and 8, the first die pad 21 and the second die pad 22 are both flat.

As shown in FIGS. 7 and 8, the first die pad 21 has a first upper surface 211 and a first lower surface 212. The first upper surface 211 faces away from the first lower surface 212. In the present embodiment, the first upper surface 211 is coated with the internal plating 72. The control element 111 and the insulating element 12 are attached to the internal plating 72 that is on the first upper surface 211, by die bonding via a bonding layer (not shown). The entire first lower surface 212 is in contact with the sealing resin 6.

As shown in FIG. 7, the second die pad 22 has a second upper surface 221 and a second lower surface 222. The second upper surface 221 faces away from the second lower surface 222. In the present embodiment, the second upper surface 221 is coated with the internal plating 72. The drive element 112 is attached to the internal plating 72 that is on the upper surface 221, by die bonding via a bonding layer (not shown). The entire second lower surface 222 is in contact with the sealing resin 6.

As shown in FIGS. 2 and 7, the first die pad 21 and the second die pad 22 are spaced apart in the second direction Y, with the sealing resin 6 in between. In the present embodiment, the sealing resin 6 may be made of a black epoxy resin that is electrically insulative, as will be described later. Therefore, the first die pad 21 is electrically insulated from the second die pad 22 by the insulating element 12 and the sealing resin 6.

Once bonded to the circuit board of an inverter, the first terminals 3 provide a conduction path between the semiconductor device A1 and the circuit board. As shown in FIGS. 1 and 3, the first terminals 3 are arranged in the first direction X. In addition, the first terminals 3 extend in the second direction Y beyond one of first side surfaces 63 of the sealing resin 6 as will be described later, to be partially exposed from the sealing resin 6. The first terminals 3 include a plurality of first inner terminals 31 and a pair of first outer terminals 32.

As shown in FIGS. 2 and 3, the first inner terminals 31 are arranged between the pair of first outer terminals 32 in the first direction X. Each first inner terminal 31 has a lead section 311 and a pad section 312.

The lead section 311 is a rectangular portion extending in the second direction Y. As shown in FIGS. 5 and 6, the portion of the lead section 311 extending beyond the one first side surface 63 of the sealing resin 6 is bent into a gull wing profile. In addition, the extended portion of the lead section 311 is coated with external plating 73 as shown in FIG. 7. In other words, the portion of the lead section 311 not covered by the external plating 73 is covered by the sealing resin 6. The pad section 312 is continuous with the lead section 311 and has a rectangular shape wider than the lead section 311 in the first direction X. In the present embodiment, the upper surface of the pad section 312 is coated with the internal plating 72 as shown in FIG. 7. The pad section 312 is flat and entirely encapsulated in the sealing resin 6.

As shown in FIGS. 2 and 3, the pair of first outer terminals 32 are located on opposite sides of the plurality of first inner terminals 31 in the first direction X. Each first outer terminal 32 has a lead section 321 and a pad section 322.

The lead section 321 has a rectangular shape elongated in the second direction Y. As shown in FIGS. 5 and 6, the portion of the lead section 321 extending beyond the one first side surface 63 of the sealing resin 6 is bent into a gull wing profile. As with the lead section 311 of each first inner terminal 31, the extended portion of the lead section 321 is coated with the external plating 73. In other words, the portion of the lead section 321 not covered by the external plating 73 is covered by the sealing resin 6. The pad section 322 is continuous with the lead section 321 and has a rectangular shape wider than the lead section 321 in the first direction X. In the present embodiment, as with the pad section 312 of each first inner terminal 31, the upper surface of the pad section 322 (the surface facing in the same direction as the first upper surface 211 of the first die pad 21 in FIG. 7) is coated with the internal plating 72. The pad section 322 is flat and entirely encapsulated in the sealing resin 6.

As with the first terminals 3, once bonded to the circuit board of an inverter, the second terminals 4 provides a conduction path between the semiconductor device A and the circuit board. As shown in FIGS. 1 and 4, the second terminals 4 are arranged in the first direction X. As shown in FIG. 2, the plurality of second terminals 4 are located on the opposite side of the semiconductor elements 11 from the plurality of first terminals 3 in the second direction Y. The second terminals 4 extend in the second direction Y beyond the other one of the two first side surfaces 63 of the sealing resin 6, which will be described later. The plurality of second terminals 4 include a plurality of second inner terminals 41 and a pair of second outer terminals 42.

As shown in FIGS. 2 and 4, the second inner terminals 41 are arranged between the pair of second outer terminals 42. In addition, the second inner terminals 41 are arranged between a pair of second support terminals 52. The pair of second support terminals 52 are included in the support terminals 5 as will be described later. Each second inner terminal 41 has a lead section 411 and a pad section 412.

The lead section 411 has a rectangular shape elongated in the second direction Y. As shown in FIGS. 5 and 6, the portion of the lead section 411 extending beyond the other first side surface 63 of the sealing resin 6 is bent into a gull wing profile. In addition, the extended portion of the lead section 411 is coated with the external plating 73. In other words, the portion of the lead section 411 not covered by the external plating 73 is covered by the sealing resin 6. The pad section 412 is continuous with the lead section 411 and has a rectangular shape wider than the lead section 411 in the first direction X. As shown in FIG. 7, in the present embodiment, the upper surface of the pad section 412 is coated with the internal plating 72. The pad section 412 is flat and entirely encapsulated in the sealing resin 6. In the present embodiment, the second terminals 4 has a shape identical to the first terminals 3.

As shown in FIGS. 2 and 4, the pair of second outer terminals 42 are arranged on opposite sides of the plurality of second inner terminals 41 in the first direction X. Each second outer terminal 42 has a lead section 421 and a pad section 422.

The lead section 421 has a rectangular shape elongated in the second direction Y. As shown in FIGS. 5 and 6, the portion of the lead section 421 extending beyond the other first side surface 63 of the sealing resin 6 is bent into a gull wing profile. As with the lead section 411 of each second inner terminal 41, the extended portion of the lead section 421 is coated with the external plating 73. In other words, the portion of the lead section 421 not covered by the external plating 73 is covered by the sealing resin 6. The portion of the lead section 421 encapsulated in the sealing resin 6 is longer than the portion of the lead section 411 of the second inner terminal 41 encapsulated in the sealing resin 6. The pad section 422 is continuous with the lead section 421 and extends in the first direction X. As shown in FIG. 2, the end of the pad section 422 is isolated from the second die pad 22. In the present embodiment, as with the pad section 412 of each second inner terminal 41, the upper surface of the pad section 422 (the surface facing in the same direction as the second upper surface 221 of the second die pad 22 in FIG. 7) is coated with the internal plating 72. The pad section 422 is flat and entirely encapsulated in the sealing resin 6.

The support terminals 5 are connected to the die pads 2 to support the die pads 2. In addition, as with the first terminals 3 and the second terminals 4, once bonded the circuit board of an inverter, the support terminals 5 provide a conduction path between the semiconductor device A1 and the circuit board. The support terminals 5 are provided in pairs and include a pair of first support terminals 51 and a pair of second support terminals 52. As shown in FIG. 2, the pair of first support terminals 51 are spaced apart in the first direction X and connected to the opposite ends of the first die pad 21. The pair of second support terminals 52 are spaced apart in the first direction X and connected to the opposite ends of the second die pad 22.

As shown in FIGS. 2 and 3, the pair of first support terminal 51 are arranged on opposite sides of the plurality of first terminals 3 in the first direction X. The first support terminals 51 extend in the second direction Y beyond the same first side surface 63 as the first terminals 3, to be partially exposed from the sealing resin 6. Each first support terminal 51 has a lead section 511 and a pad section 512.

The lead section 511 has a rectangular shape elongated in the second direction Y. As shown in FIGS. 5 and 6, the portion of the lead section 511 extending beyond the one first side surface 63 of the sealing resin 6 is bent into a gull wing profile. As with the lead section 311 of each first inner terminal 31, the extended portion of the lead section 511 is coated with the external plating 73. In other words, the portion of the lead section 511 not covered by the external plating 73 is covered by the sealing resin 6. In addition, the portion of the lead section 511 encapsulated in the sealing resin 6 is longer than the portion of the lead section 311 of the first inner terminal 31 encapsulated in the sealing resin 6, or than the portion of the lead section 321 of the first outer terminal 32 encapsulated in the sealing resin 6. The pad section 512 is continuous with the lead section 511 and extends in the first direction X. As shown in FIG. 2, the end of the pad section 512 is connected to the first die pad 21. In the present embodiment, as with the pad section 312 of each first inner terminal 31, the upper surface of the pad section 512 is coated with the internal plating 72 as shown in FIG. 8. The pad section 512 is flat and entirely encapsulated in the sealing resin 6.

As shown in FIGS. 2 and 4, the plurality of second inner terminals 41 are arranged between the pair of second support terminals 52 in the first direction X. In addition, the pair of second support terminals 52 are arranged between the pair of second outer terminals 42 in the first direction X. That is, each second support terminal 52 is located between two of the second terminals 4. The second support terminals 52 extend in the second direction Y beyond the same first side surface 63 as the second terminals 4, to be partially exposed from the sealing resin 6. Each second support terminal 52 has a lead section 521, a pad section 522, and a connecting section 524.

The lead section 521 has a rectangular shape elongated in the second direction Y. As shown in FIGS. 5 and 6, the portion of the lead section 521 extending beyond the other first side surface 63 of the sealing resin 6 is bent into a gull wing profile. In addition, the extended portion of the lead section 521 is coated with the external plating 73, as with the lead section 411 of each second inner terminal 41. In other words, the portion of the lead section 521 not covered by the external plating 73 is covered by the sealing resin 6. The pad section 522 is continuous with the lead section 521 and wider than the lead section 521 in the first direction X. The pad section 522 extends in the second direction Y. In the present embodiment, as with the pad section 412 of each second inner terminal 41, the upper surface of the pad section 522 (the surface facing in the same direction as the second upper surface 221 of the second die pad 22 in FIG. 7) is coated with the internal plating 72. The pad section 522 is flat and entirely encapsulated in the sealing resin 6. The connecting section 524 extends continuously from the pad section 522 in the first direction X. The end of the connecting section 524 is connected to the second die pad 22 as shown in FIG. 2. In the present embodiment, as with the pad section 522, the upper surface of the connecting section 524 (the surface facing in the same direction as the upper surface of the pad section 522) is coated with the internal plating 72. The connecting section 524 is entirely encapsulated in the sealing resin 6.

Figure 9:
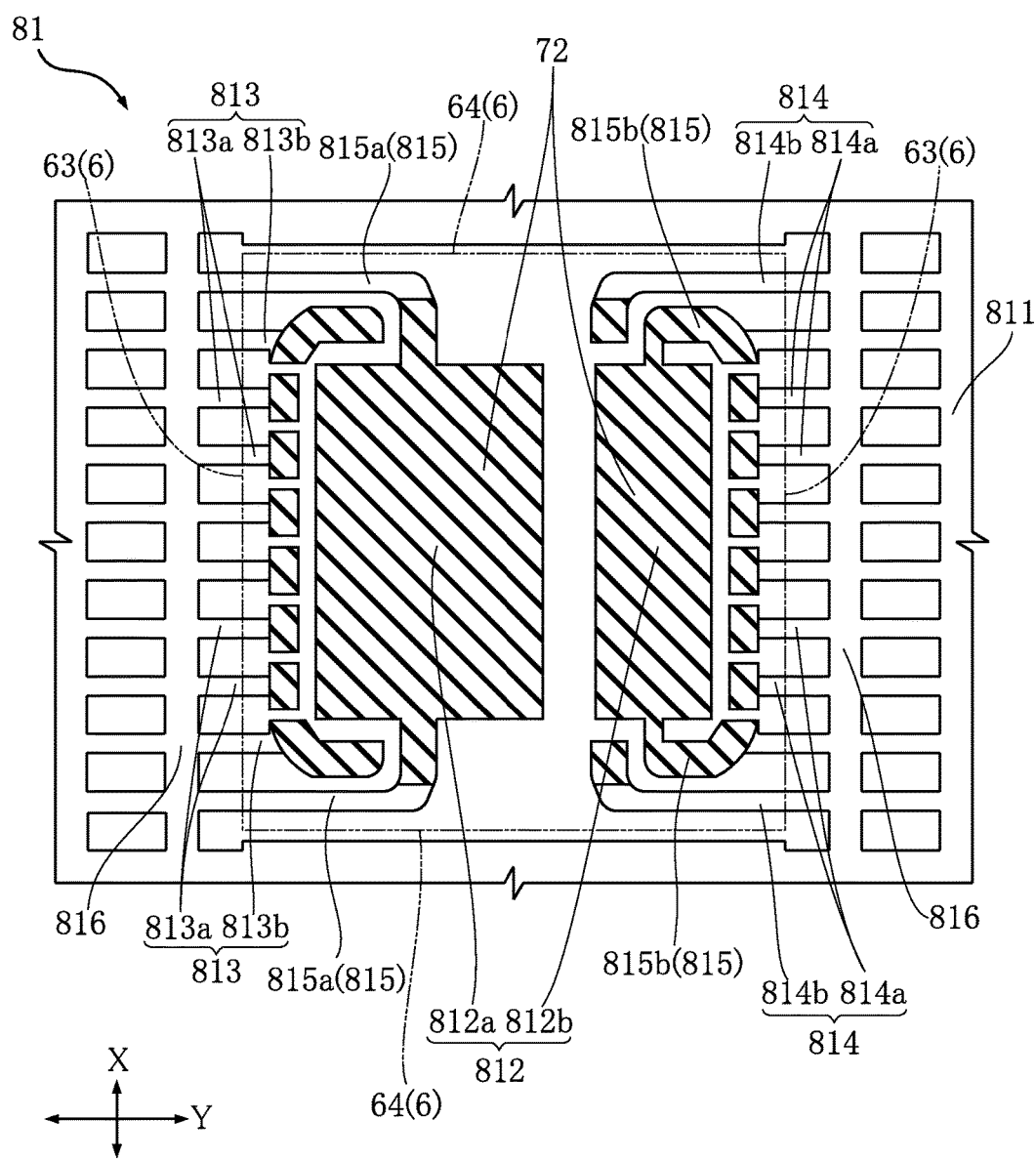
FIG. 9 is a plan view of a lead frame of the semiconductor device shown in FIG. 1.

FIG. 9 is a plan view of the lead frame 81 included in the semiconductor device A1. In FIG. 9, the region where the sealing resin 6 is to be formed is enclosed by imaginary lines (dash-double-dot lines). In addition, the regions where the internal plating 72 are to be formed are shown crosshatched.

The conductive support described above is formed from the lead frame 81. More specifically, the die pads 2, the first terminals 3, the second terminals 4, and the support terminals 5 are all formed from the same lead frame 81 in the production of the semiconductor device A1. The lead frame 81 may be made of an alloy containing Cu. The lead frame 81 has an outer frame 811, a plurality of islands 812, a plurality of first leads 813, a plurality of second leads 814, a plurality of support leads 815, and a pair of dam bars 816. Among the components mentioned above, the outer frame 811 and the dam bars 816 are not components constituting part of the semiconductor device A1. The following describes the lead frame 81 with reference to FIG. 9.

The outer frame 811 encloses the islands 812, the first leads 813, the second leads 814, the support leads 815, and the dam bars 816. The first leads 813, as well as the second leads 814 and the support leads 815, are connected to the outer frame 811 in spaced relationship along the first direction X. The dam bars 816 are connected to the outer frame 811 in spaced relationship along the second direction Y.

In plan view, each island 812 has a rectangular shape elongated in the first direction X. The islands 812 constitute the die pads 2. The islands 812 are supported by the outer frame 811 via the support leads 815. The islands 812 includes a first island 812a and a second island 812b. The first island 812a constitutes the first die pad 21, and the second island 812b constitutes the second die pad 22. The first island 812a is spaced apart from the second island 812b.

The first leads 813 are arranged in the first direction X and extend in the second direction Y. The first leads 813 constitute the first terminals 3. Each first lead 813 is connected at one end to the outer frame 811. The plurality of first leads 813 include a plurality of first inner leads 813a and a pair of first outer leads 813b. The first inner leads 813a constitute the first inner terminals 31, and the first outer leads 813b constitute the first outer terminals 32.

The second leads 814 are arranged in the first direction X and extend in the second direction Y. The second leads 814 are located on the opposite side of the islands 812 from the first leads 813 in the second direction Y. The second leads 814 constitute the second terminals 4. Each second lead 814 is connected at one end to the outer frame 811. The plurality of second leads 814 include a plurality of second inner leads 814a and a pair of second outer leads 814b. The second inner leads 814a constitute the second inner terminals 41, and the second outer leads 814b constitute the second outer terminals 42.

Each support lead 815 extends in the second direction Y, and is connected at one end to the outer frame 811. The other end of each support lead 815 is connected to a corresponding one of the islands 812. The support leads 815 constitute the support terminals 5. The support leads 815 include a pair of first support leads 815a and a pair of second support leads 815b. The first support leads 815a constitute the first support terminals 51, and the second support leads 815b constitute the second support terminals 52. The pair of first support leads 815a are spaced from each other in the first direction X and connected to the opposite ends of the first island 812a. The pair of second support leads 815b are spaced from each other in the first direction X and connected to the opposite ends of the second island 812b.

Each of the pair of dam bars 816 extends in the first direction X and is connected at each end to the outer frame 811. The dambars 816 extend in the first direction X to support the first leads 813, the second leads 814, and the support leads 815. In the production of the sealing resin 6, in addition, the dam bars 816 serve to stop the flow of molten synthetic resin. One of the dam bars 816 is connected to the first inner leads 813a, the first outer leads 813b, and the first support leads 815a. The other of the dam bars 816 is connected to the second inner leads 814a, the second outer leads 814b, and the second support leads 815b.

The sealing resin 6 may be made of a black epoxy resin that is electrically insulative. The sealing resin 6 partially encapsulates the first terminals 3, the second terminals 4, and the support terminals 5 and fully encapsulates the semiconductor elements 11, the insulating element 12, the die pads 2, the bonding wires 71, and the internal plating 72. The sealing resin 6 is formed by transfer molding using a mold. The sealing resin 6 has an upper surface 61, a lower surface 62, a pair of first side surfaces 63, and a pair of second side surfaces 64.

As shown in FIGS. 3 to 6, the upper surface 61 of the sealing resin 6 faces upward, whereas the lower surface 62 faces downward. The upper surface 61 and the lower surface 62 of the sealing resin 6 face away from each other. The upper surface 61 and the lower surface of the sealing resin 6 are both flat.

As shown in FIGS. 1 and 2, the pair of first side surfaces 63 of the sealing resin 6 are spaced apart in the second direction Y and face away from each other. In the present embodiment, the first terminals 3 and the first support terminals 51 are exposed from one of the pair of first side surfaces 63. The second terminals 4 and the second support terminals 52 are exposed from the other of the pair of first side surfaces 63. Each first side surface 63 has a first upper section 631, a first middle section 632, and a first lower section 633.

As shown in FIGS. 3 to 6, the first upper section 631 has an upper edge connected to the upper surface 61 of the sealing resin 6 and a lower edge connected to the first middle section 632. The first upper section 631 is inclined upwardly toward an inward position of the semiconductor device A1.

As shown in FIGS. 3 to 6, the first middle section 632 has an upper edge connected to the first upper section 631 and a lower edge connected to the first lower section 633. The first middle section 632 is vertical relative to the upper surface 61 and the lower surface 62 of the sealing resin 6. The first terminals 3 and the first support terminals 51 are exposed from one of the first middle sections 632. The second terminals 4 and the second support terminals 52 are exposed from the other of the first middle sections 632.

As shown in FIGS. 3 to 6, the first lower section 633 has an upper edge connected to the first middle section 632 and a lower edge connected to the lower surface 62 of the sealing resin 6. The first lower section 633 is inclined downwardly toward an inward position of the semiconductor device A1.

As shown in FIGS. 1 and 2, the pair of second side surfaces 64 of the sealing resin 6 are spaced apart in the first direction X and face away from each other. As shown in FIGS. 2, 5, and 6, the conductive support is not exposed from either of the pair of second side surfaces 64. Each second side surface 64 has a second upper section 641, a second middle section 642, and a second lower section 643.

As shown in FIGS. 3 to 6, the second upper section 641 has an upper edge connected to the upper surface 61 of the sealing resin 6 and a lower edge connected to the second middle section 642. The second upper section 641 is inclined upwardly toward an inward position of the semiconductor device A1.

As shown in FIGS. 3 to 6, the second middle section 642 has an upper edge connected to the second upper section 641 and a lower edge connected to the second lower section 643. The second middle section 642 is vertical relative to the upper surface 61 and the lower surface 62 of the sealing resin 6 and meet the first middle sections 632 at a right angle. In the present embodiment, the second middle sections 642 have a height substantially equal to the height of the first middle sections in the thickness direction of the semiconductor device A1.

As shown in FIGS. 3 to 6, the second lower section 643 has an upper edge connected to the second middle section 642 and a lower edge connected to the lower surface 62 of the sealing resin 6. The second lower section 643 is inclined downwardly toward an inward position of the semiconductor device A1.

The bonding wires 71 connect the first terminals 3, the second terminals 4, and the support terminals 5 to together provide a conduction path within the semiconductor device A1. The conduction path is used by the semiconductor elements 11 and the insulating element 12 to perform predetermined functions. The bonding wires 71 include a plurality of first bonding wires 711, a plurality of second bonding wires 712, a plurality of third bonding wires 713, and a plurality of fourth bonding wires 714.

As shown in FIG. 2, the first bonding wires 711 provide a conduction path connecting the control element 111 to the first terminals 3 and the first support terminals 51. Each first bonding wire 711 electrically connects the control element 111 to at least one of the first terminals 3 and the first support terminal 51. Specifically, each first bonding wire 711 is bonded to the pad 111a of the control element 111 at one end. The other end of the first bonding wire 711 is bonded to one of the pad sections 312 of the first inner terminals 31, the pad sections 322 of the first outer terminals 32, and the pad sections 512 of the first support terminals 51.

As shown in FIG. 2, the second bonding wires 712 provide a conduction path between the insulating element 12 and the control element 111. The second bonding wires 712 electrically connect the insulating element 12 and the control element 111. Specifically, each second bonding wire 712 is bonded to the pad 12a of the insulating element 12 at one end and to one of the pads 111a of the control element 111 at the other end. In the present embodiment, the second bonding wires 712 are arranged in the second direction Y.

As shown in FIG. 2, the third bonding wires 713 provide a conduction path between the insulating element 12 and the control element 111. The third bonding wires 713 electrically connect the insulating element 12 to the control element 111. Specifically, each third bonding wire 713 is bonded to one of the pads 12a of the insulating element 12 at one end and to one of the pads 112a of the drive element 112 at the other end. In the present embodiment, the third bonding wires 713 are arranged in the second direction Y.

As shown in FIG. 2, the fourth bonding wires 714 provide a conduction path connecting the drive element 112 to the second terminals 4 and the second support terminals 52. Each fourth bonding wire 714 electrically connects the drive element 112 to at least one of the second terminals 4 and the second support terminals 52. Specifically, each fourth bonding wire 714 is bonded to one of the pads 112a of the drive element 112 at one end. The other end of the fourth bonding wire 714 is bonded to one of the pad sections 412 of the second inner terminals 41, the pad sections 422 of the second outer terminals 42, and the pad sections 522 of the second support terminals 52.

FIGS. 10 to 14 are each partial sectional view illustrating a manufacturing step of the bonding wires 71 of the semiconductor device A1.

Each second bonding wire 712 bonded to the insulating element 12 has a first bonding portion 712a, and each third bonding wire 713 bonded to the insulating element 12 has a first bonding portion. With reference to FIGS. 10 to 14, the following describes the bonding process of the second bonding wire 712 as well as the third bonding wire 713.

Figure 10:
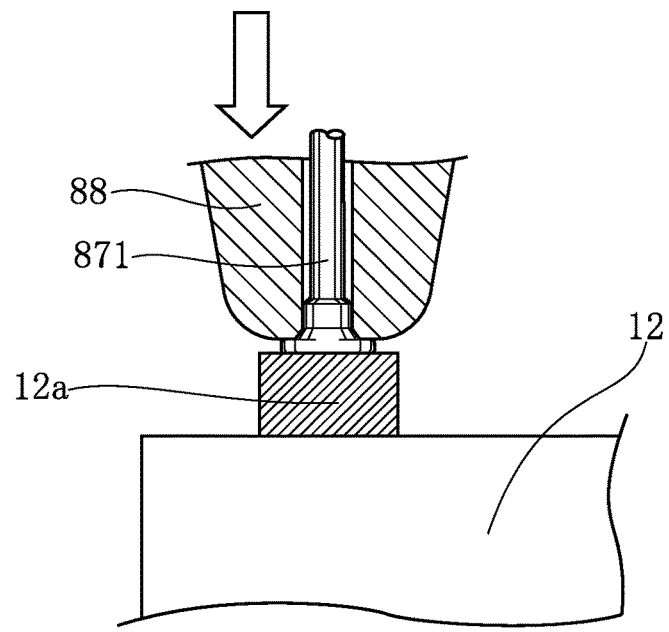
FIG. 10 is a partial sectional view illustrating a manufacturing step of a bonding wire of the semiconductor device shown in FIG. 1.
Figure 11:
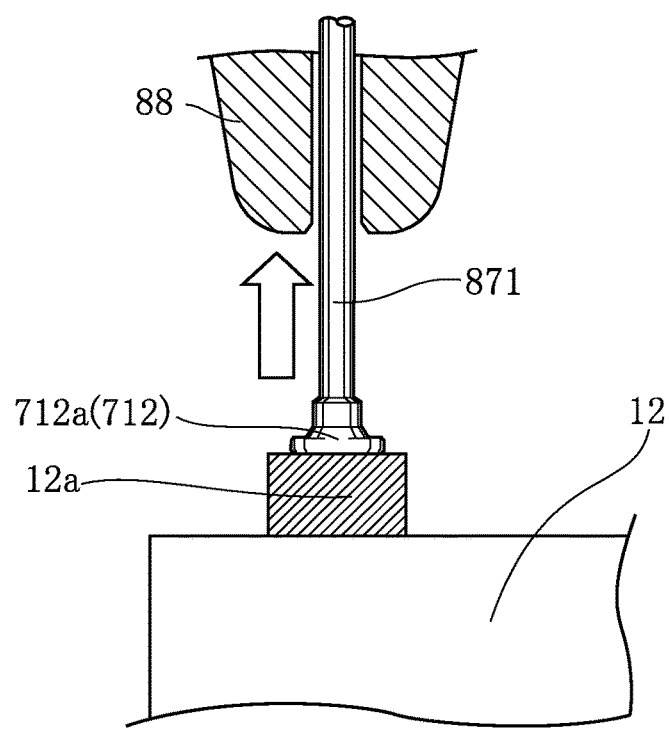
FIG. 11 is a partial sectional view illustrating a manufacturing step of the bonding wire of the semiconductor device shown in FIG. 1.

In the step illustrated in FIG. 10, a capillary 88 is lowered toward the insulating element 12 to press the tip of a wire 871, which will be formed into a bonding wire 71, against a pad 12a of the insulating element 12. By the action of ultrasonic waves emitted by the capillary 88 and under the weight of the capillary 88, the tip of the wire 871 is bonded to the pad 12a. The capillary 88, which is a cylindrical tool having a through-hole and a smoothly curved tip, can freely feed the wire 871 forward or backward. In the subsequent step illustrated in FIG. 11, the capillary 88 is raised while forwarding the wire 871. As a result, the first bonding portion 712a of the second bonding wire 712 is formed on the pad 12a. The first boding portion of the third bonding wire 713 can be formed in a similar manner.

Figure 12:
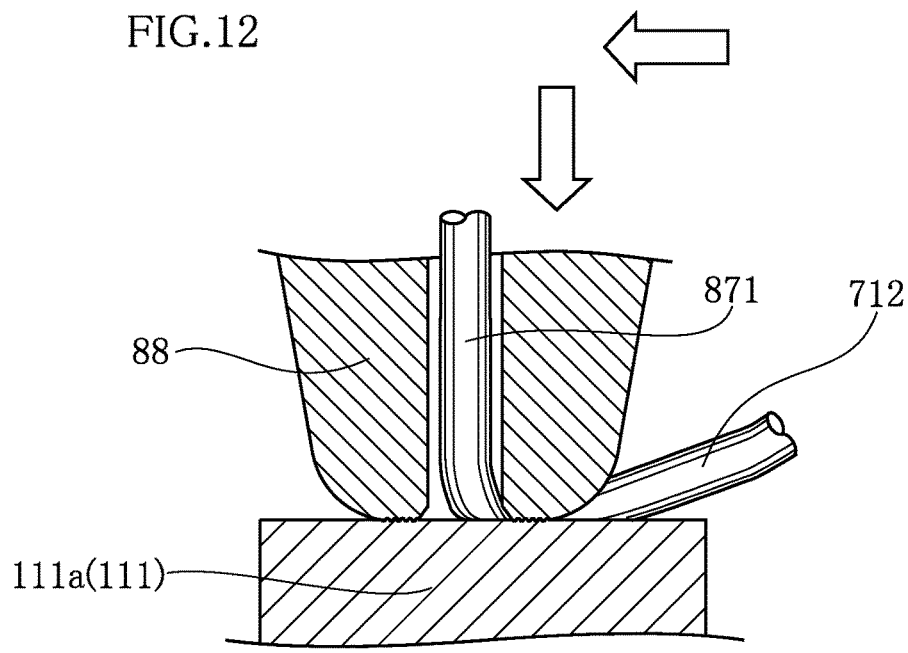
FIG. 12 is a partial sectional view illustrating a manufacturing step of the bonding wire of the semiconductor device shown in FIG. 1.
Figure 13:
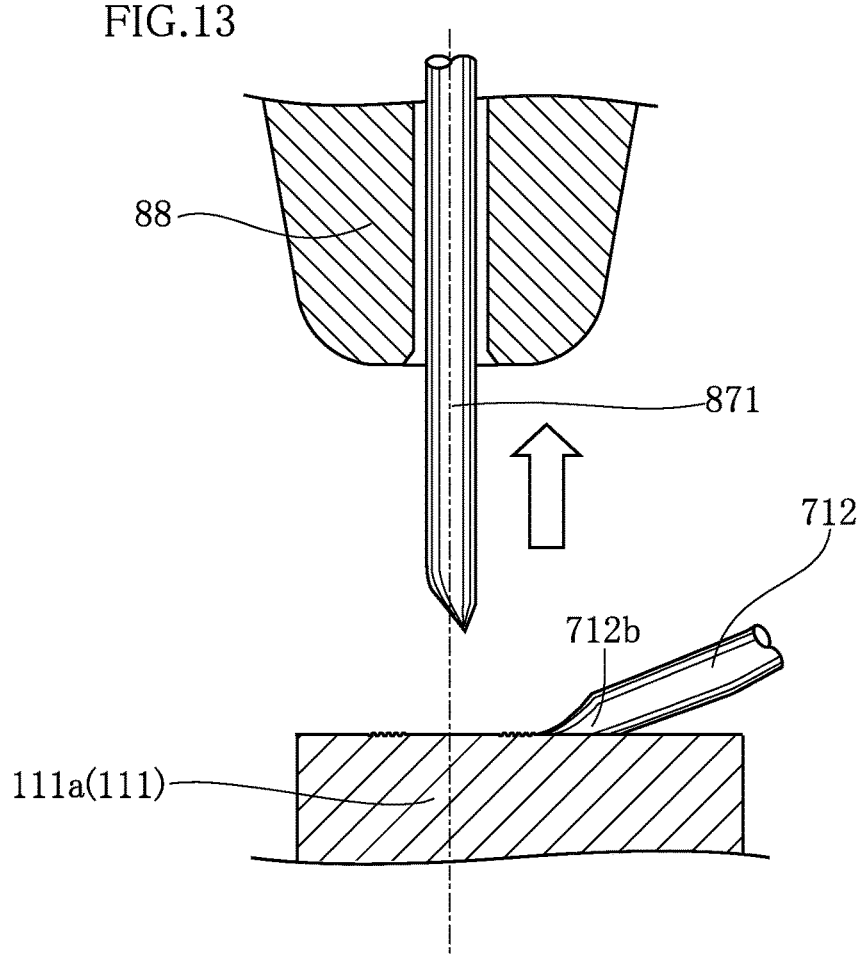
FIG. 13 is a partial sectional view illustrating a manufacturing step of the bonding wire of the semiconductor device shown in FIG. 1.

In the subsequent step illustrated in FIG. 12, the capillary 88 is moved to a position directly above the pad 111a of the control element 111 and then lowered until the tip of the capillary 88 is pressed against the pad 111a. In this state, the wire 871 is sandwiched between the tip of the capillary 88 and the pad 111a, causing residue of the wire 871 to adhere to the tip of the capillary 88. In a subsequent step illustrated in FIG. 13, the capillary 88 is raised to break the wire 871 off, leaving a second bonding portion 712b of the second bonding wire 712 on the pad 111a. The above steps form the second bonding wire 712 bonded to the insulating element 12 and the control element 111.

Figure 14:
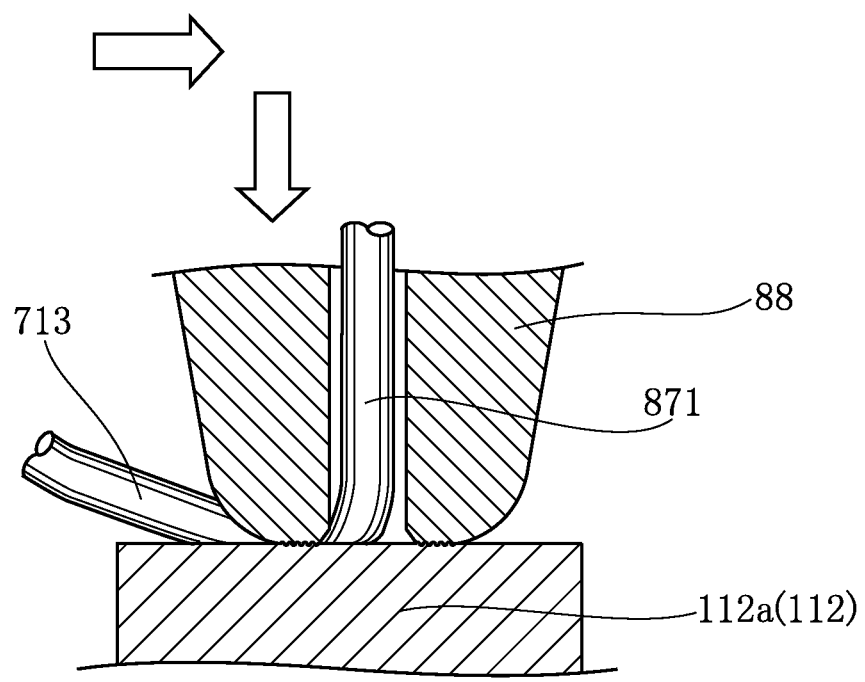
FIG. 14 is a partial sectional view illustrating a manufacturing step of the bonding wire of the semiconductor device shown in FIG. 1.

In the step of forming a second bonding portion of the third bonding wire 713 shown in FIG. 14, the tip of the capillary 88 is pressed against a pad 112a of the drive element 112. In this state, the wire 871 is sandwiched between the tip of the capillary 88 and the pad 112a, with the wire 871 in contact with the tip of the capillary 88 at a portion opposite the portion sandwiching the wire 871 in the step of forming the second bonding wire 712. The wire bonding steps described above can prevent wire residues from locally adhering to a specific portion of tip of the capillary 88. This is effective to reduce bonding failure caused by capillary contamination.

The internal plating 72 includes layers formed on the first terminals 3, the second terminals 4, and the support terminals 5. A description of the specific layers is already given above regarding the first terminals 3, the second terminals 4, and the support terminals 5. In the present embodiment, the internal plating 72 is also formed on the first upper surface 211 of the first die pad 21 as well as on the second upper surface 221 of the second die pad 22. In FIG. 9, crosshatched regions of the lead frame 81 are where the internal plating 72 are formed. The internal plating 72 serves to protect the lead frame 81 against shocks imposed upon wire bonding. The internal plating 72 may be made of silver (Ag).

The external plating 73 includes layers formed the first terminals 3, the first support terminals 51, the second terminals 4, and the second support terminal 52 so as to coat portions of the respective terminals exposed from the first side surfaces 63 of the sealing resin 6. When the semiconductor device A1 is surface mounted to the circuit board of an inverter by solder bonding, the external plating 73 serves to improve the strength of solder bonding and protect the portions not encapsulated in the sealing resin 6 from erosion due to solder bonding. The external plating 73 may be made of an alloy containing tin (Sn), such as solder.

The following now describes advantageous effects of the semiconductor device A1.

According to the present embodiment, the first terminals 3 and the second terminals 4 are exposed from a different one of the pair of first side surfaces 63 of the sealing resin 6. The die pads 2, the first terminals 3, the second terminals 4, and the support terminals 5 are all components of the conductive support. Any component of the conductive support, such as an island support, is not exposed from the second side surfaces 64 of the sealing resin 6. That is, no metal components of the conductive support not encapsulated by the sealing resin 6 are located near the second terminals 4, which receives application of higher voltage than the first terminals 3. This allows the semiconductor device A1 to further improve the dielectric strength.

The second bonding wires 712, as well as the third bonding wires 713, bonded to the insulating element 12 are arranged to extend in the second direction Y. In an example in which the semiconductor device A1 is mounted on the inverter of an electric vehicle or hybrid vehicle, the second bonding wires 712 are subjected to application of about 5 V, whereas the third bonding wires 713 are subjected to application of 600 V or higher. To further improve the dielectric strength of the semiconductor device A1, the above-described layout of the second bonding wires 712 and the third bonding wires 713 is preferable.

To further improve the dielectric strength of the semiconductor device A1, it is preferable to have a longer distance separating the first terminals 3 from the second terminals 4. In the illustrated example, the semiconductor elements 11, the insulating element 12, and the die pads 2 each have a rectangular shape elongated in the first direction X in plan view. Such an configuration is advantageous to reducing the overall size of the semiconductor device A1.

The first die pad 21 is supported by the pair of first support terminals 51 substantially at the middle in the second direction Y along the respective edges. Similarly, the second die pad 22 is supported by the pair of second support terminals 52 substantially at the middle in the second direction Y along the respective edges. When a molten resin is injected into the mold cavity to form the sealing resin 6, the die pads 2 tend to be displaced by the molten rein in the thickness direction of the semiconductor device A1. However, the above-described configuration is effective to hold the die pads 2 against such displacement and protect the semiconductor device A1 from resulting defects.

In a typical manufacturing process of the sealing resin 6, a molten resin is injected into a mold cavity from a position corresponding to a corner of the lead frame 81. Unlike an island support of a conventional example, the conductive support according to the present embodiment is not exposed from the pair of the second side surfaces 64. This configuration allows the molten resin to be injected into the mold cavity from a midpoint in the second direction Y, rather than from a corner. Such injection is effective to produce the sealing resin 6 that is be void free.

FIGS. 15 to 18 illustrate other embodiments of the present invention. In the figures, the same reference signs denote components that are the same as or similar to the components of the semiconductor device A1 described above.

Second Embodiment

Figure 15:
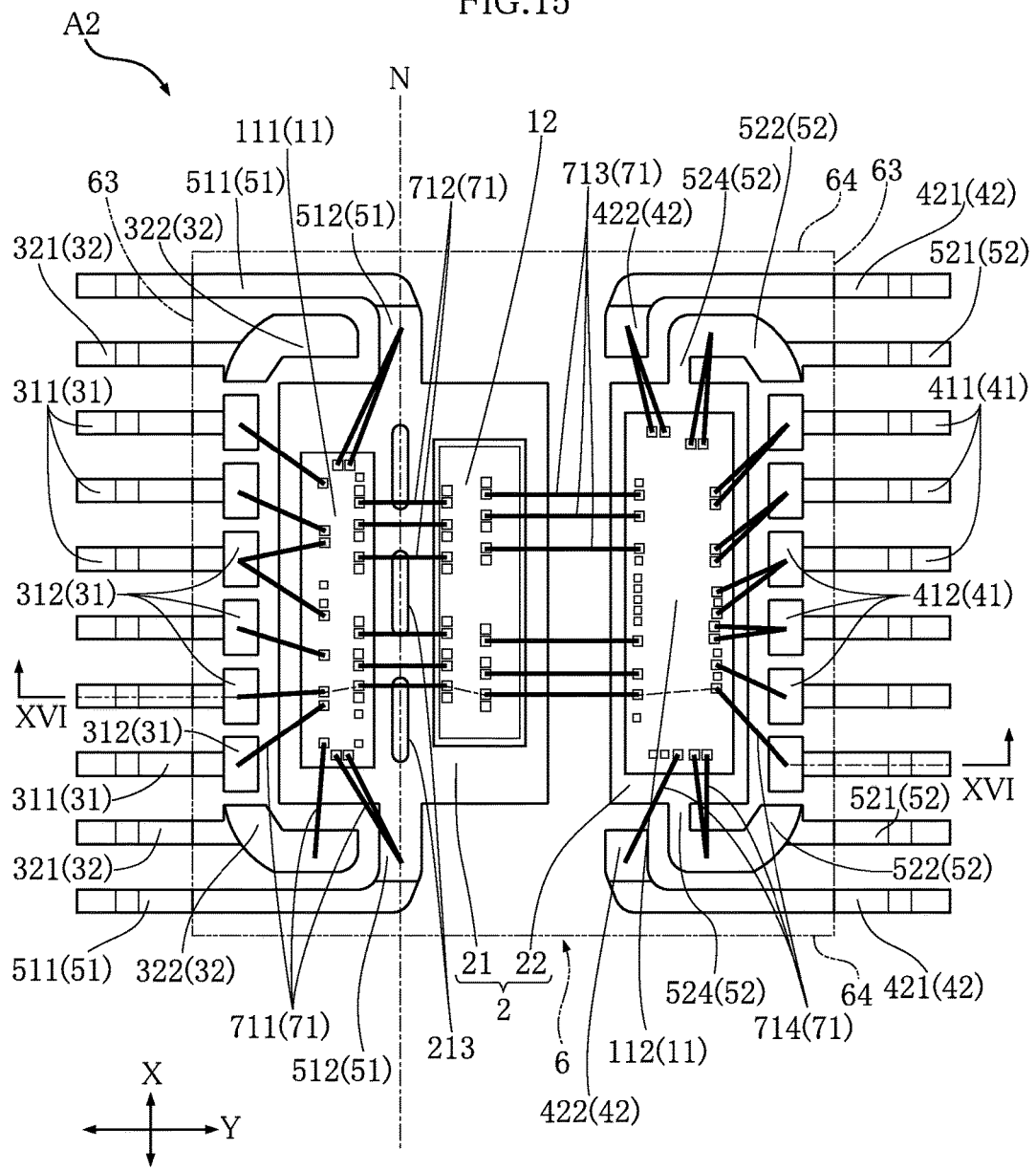
FIG. 15 is a plan view of a semiconductor device according to a second embodiment of the present invention (with a sealing resin omitted).
Figure 16:
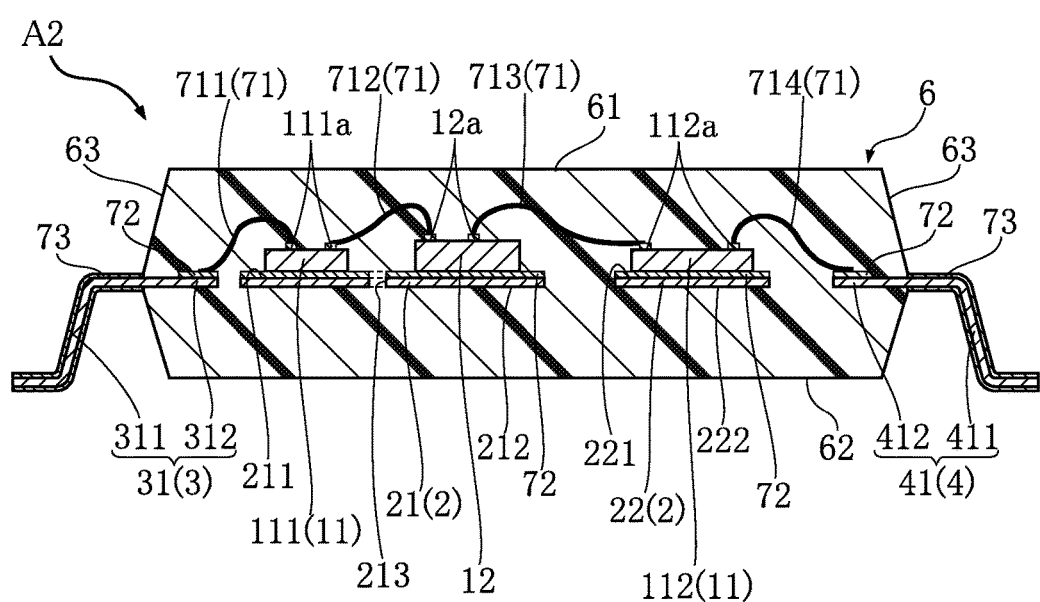
FIG. 16 is a sectional view along line XVI-XVI of FIG. 15.

With reference to FIGS. 15 and 16, the following describes a semiconductor device A2 according to a second embodiment of the present invention.

FIG. 15 is a plan view of the semiconductor device A2, with the sealing resin 6 omitted for clarity. FIG. 16 is a sectional view along line XVI-XVI (long and short dashed lines) of FIG. 15. In FIG. 15, the sealing resin 6 is omitted and indicated only by imaginary lines (dash-double-dot lines). In FIG. 16, the sealing resin 6 is illustrated. The semiconductor device A2 according to the present embodiment is rectangular in plan view.

The semiconductor device A2 according to the present embodiment differs from the semiconductor device A1 in the shape of the first die pad 21. As shown in FIGS. 15 and 16, the first die pad 21 has one or more through-holes 213. According to the present embodiment, the first die pad 21 has three through-holes 213 between the control element 111 and the insulating element 12. Each through-hole 213 is elongated in the first direction X. Any number of through-holes 213 may be provided in any shape. As shown in FIG. 15, on the first die pad 21, the through-holes 213 longitudinally aligned with the pair of first support terminals 51 along a straight line N (long and short dashed lines) extending in the first direction X.

Similarly to the first embodiment, the present embodiment enables the semiconductor device A2 to further improve the dielectric strength. According to the present embodiment, in addition, the first die pad 21 has the through-holes 213. Generally, in the production of the sealing resin, the first die pad 21 having a larger area than the second die pad 22 may be more prone to formation of voids near the first die pad 21. However, when a molten resin is injected to into a mold cavity to form the sealing resin 6, molten resin can flow through the through-holes 213 and more reliably fill the mold cavity without leaving voids.

Third Embodiment

Figure 17:
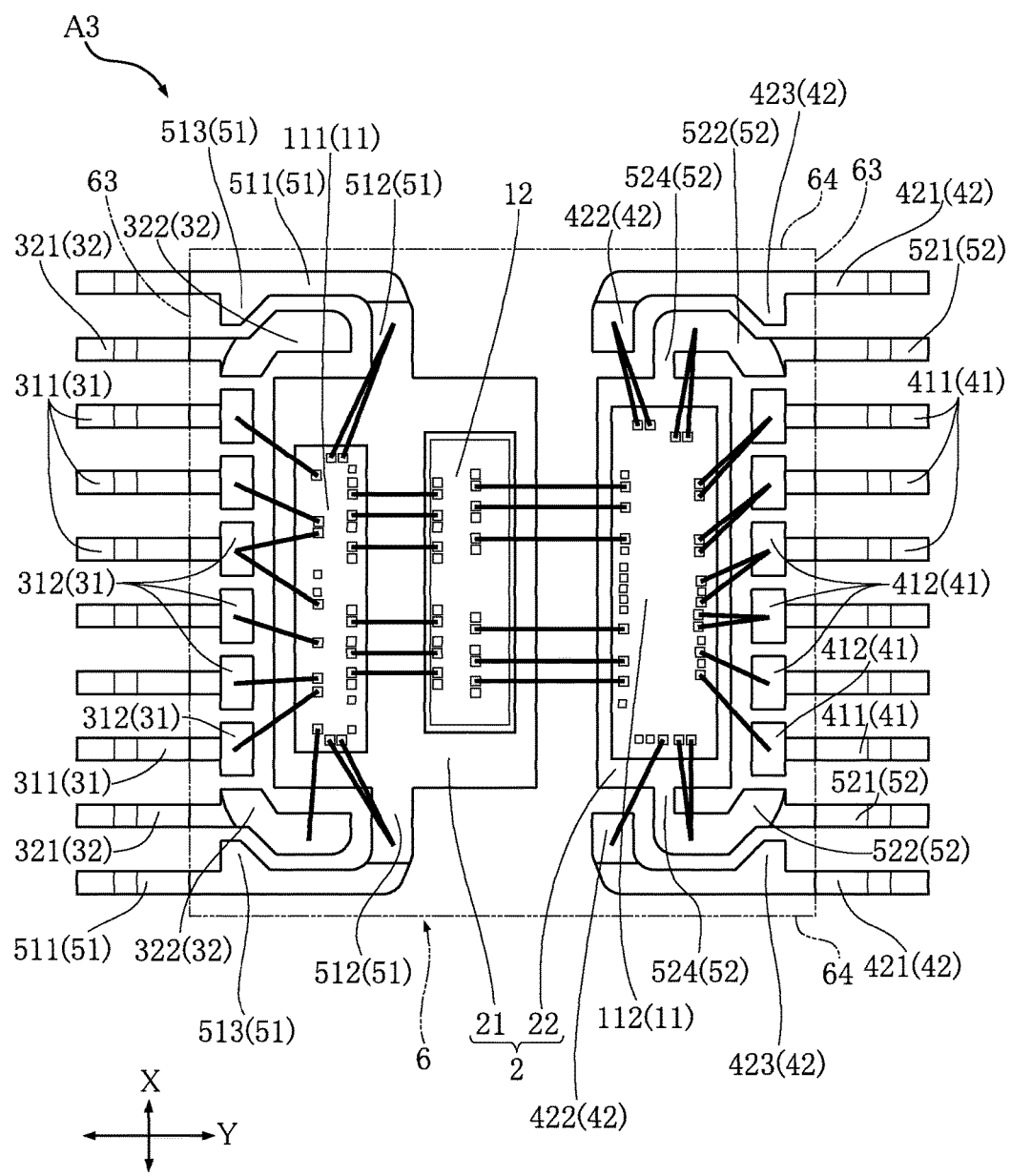
FIG. 17 is a plan view of a semiconductor device according to a third embodiment of the present invention (with a sealing resin omitted).
Figure 18:
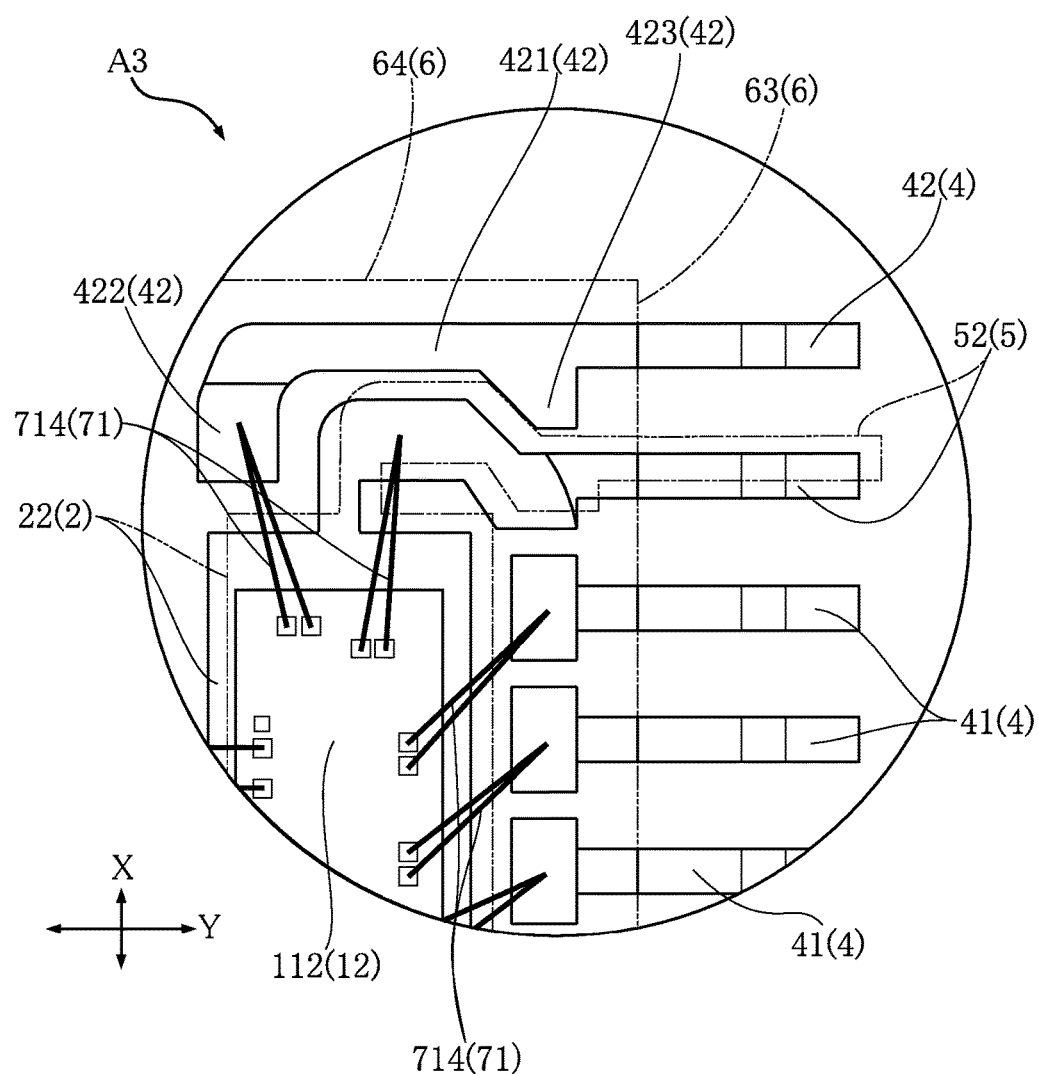
FIG. 18 is an enlarged view of an upper right portion of FIG. 17.

With reference to FIGS. 17 and 18, the following describes a semiconductor device A3 according to a third embodiment of the present invention.

FIG. 17 is a plan view of the semiconductor device A3 with the sealing resin 6 omitted for clarity. FIG. 18 is an enlarged view of an upper right part of FIG. 17. In FIGS. 17 and 18, the sealing resin 6 is indicated only by imaginary lines (dash-double-dot lines). FIG. 18 shows the state where a second support terminal 52 is moved to a position indicated by imaginary lines (dash-double-dot lines), in response to a force pulling the second support terminal 52 out from the sealing resin 6 in the second direction Y. The semiconductor device A3 according to the present embodiment is rectangular in plan view.

The semiconductor device A3 according to the present embodiment differs from the semiconductor devices A1 and A2 in the shape of the second outer terminals 42 and also in the shape of the first support terminals 51. As shown in FIGS. 17 and 18, the pair of second outer terminals 42 are two second terminals 4 arranged outside the pair of second support terminals 52 in the first direction X and each second outer terminal 42 has a lug portion projecting toward a corresponding one of the second support terminals 52. According to the present embodiment, each lug portion 423 has a trapezoidal shape in plan view. Alternatively, the lug portion 423 may have a rectangular shape or any other shape in plan view. For the reason related to the production of the lead frame 81, each first support terminal 51 also has a lug portion 513 projecting toward a corresponding one of the first outer terminal 32.

Similarly to the first and second embodiments, the present embodiment enables the semiconductor device A3 to further improve the dielectric strength. In addition, as each second outer terminal 42 has a lug portion 423, the following is archived. That is, since the second die pad 22 has a smaller area than the first die pad 21, the bonding strength of the second die pad 22 to the sealing resin 6 is lower than the bonding strength of the first die pad 21 to the sealing resin 6. Therefore, the second die pad 22 may be more prone to unintentional detachment from the sealing resin 6 when a pulling force in the second direction Y is applied to the second support terminals 52 at the time of cutting the lead frame 81 in the process of dicing after the formation of the sealing resin 6. As shown in FIG. 18, the lug portion 423 projects in the direction (first direction X) perpendicular to the direction of the pulling force (second direction Y) applied to the second support terminal 52. Therefore, the lug portion 423 counteracts the pulling force acting on the second support terminal 52 to urge the second die pad 22 to be detached from the sealing resin. In this manner, the semiconductor device A3 according to the present embodiment can prevent detachment of the second die pad 22 from the sealing resin 6.

The semiconductor device according to the present invention is not limited to those described above in the specie embodiments. Various modifications may be made to the configurations of the respective component parts of the semiconductor device according to the present invention.

The invention claimed is:

1. A semiconductor device comprising:
a semiconductor element circuit;
a conductive support that includes: a die pad on which the semiconductor element circuit is mounted; first terminals mutually spaced apart in a first direction; second terminals mutually spaced apart in the first direction and disposed opposite to the first terminals in a second direction with respect to the semiconductor element circuit, the second direction being perpendicular to the first direction; and a support terminal formed integral with the die pad; and an insulating element mounted only on the die pad and electrically connected to the semiconductor element circuit by a plurality of wires
a sealing resin that partially covers the first terminals, the second terminals and the support terminal, while also covering the semiconductor element circuit, the die pad and the insulating element,
wherein the sealing resin has a pair of first side surfaces spaced apart in the second direction and a pair of second side surfaces spaced apart in the first direction,
the first terminals and the second terminals are exposed from the pair of first side surfaces, and the conductive support is not exposed from the pair of second side surfaces,
wherein the die pad has a first edge and a second edge that are spaced apart from each other in the first direction, and the support terminal comprises a first support terminal and a second support terminal that extend from the first edge and the second edge, respectively.

2. The semiconductor device according to claim 1, wherein each of the first support terminal and the second support terminal includes a straight portion extending in the first direction, and the straight portion connects directly to the die pad and is covered by the sealing resin.

3. The semiconductor device according to claim 1, wherein the die pad is referred to as a first die pad, and the semiconductor device further comprises a second die pad spaced apart from the first die pad in the second direction.

4. The semiconductor device according to claim 3, further comprising a pair of additional support terminals,
wherein the second die pad has two edges spaced apart from each other in the first direction, and
the additional support terminals are connected to the two edges of the second die pad, respectively.

5. The semiconductor device according to claim 4, wherein the first and the second support terminals and the additional support terminals are exposed from the first side surfaces.

6. The semiconductor device according to claim 4, wherein the first die pad is formed with a through-hole.

7. The semiconductor device according to claim 6, wherein parts of the respective first and second support terminals and the through-hole are aligned with each other along a straight line extending in the first direction.

8. The semiconductor device according to claim 4, wherein the first terminals and the first and the second support terminals are exposed from a same one of the first side surfaces of the sealing resin.

9. The semiconductor device according to claim 8, wherein the second terminals and the additional support terminals are exposed from the other one of the first side surfaces of the sealing resin.

10. The semiconductor device according to claim 4, wherein the first terminals are located between the first and the second support terminals in the first direction.

11. The semiconductor device according to claim 4, wherein each of the additional support terminals is located between two of the second terminals in the first direction.

12. The semiconductor device according to claim 11, wherein one of said two of the second terminals is formed with a lug portion projected toward said each of the additional support terminals.

13. The semiconductor device according to claim 3, wherein the semiconductor element circuit comprises a control element and a drive element configured to operate at a higher voltage than the control element, the control element being mounted on the first die pad, the drive element being mounted on the second die pad.

14. The semiconductor device according to claim 13, wherein the control element is electrically connected to at least one of the first terminals, and the drive element is electrically connected to at least one of the second terminals.

15. The semiconductor device according to claim 13, wherein the control element is electrically connected to at least one of the first and the second support terminals, and the drive element is electrically connected to at least one of the additional support terminals.

16. The semiconductor device according to claim 13, wherein the insulating element is electrically connected to the control element and the drive element, and the insulating element is located between the control element and the drive element in the second direction.

17. The semiconductor device according to claim 16, wherein the insulating element is formed with an inductor.

18. The semiconductor device according to claim 16, wherein each of the control element, the drive element and the insulating element has a rectangular shape elongated in the first direction in plan view.

19. The semiconductor device according to claim 16, wherein the first die pad is greater in area than the second die pad, and the insulating element is mounted on the first die pad.

20. The semiconductor device according to claim 13, further comprising bonding wires, wherein the bonding wires include a first wire and a second wire, the first wire connecting the control element to one of the first terminals, the second wire connecting the drive element to one of the second terminals.

21. The semiconductor device according to claim 20, wherein the bonding wires include a third wire and a fourth wire, the third wire connecting the control element to one of the first and the second support terminals, the fourth wire connecting the drive element to one of the additional support terminals.

22. The semiconductor device according to claim 21, wherein the bonding wires include a fifth wire connected to the insulating element.

23. The semiconductor device according to claim 22, wherein the fifth wire extends along the second direction as viewed in a third direction perpendicular to both the first direction and the second direction.

24. The semiconductor device according to claim 22, wherein the fifth wire has a first bonding portion bonded to the insulating element.

25. The semiconductor device according to claim 3, wherein each of the first die pad and the second die pad has a rectangular shape elongated in the first direction.

26. The semiconductor device according to claim 1, wherein the conductive support is made of an alloy containing Cu.

27. The semiconductor device according to claim 1, wherein the sealing resin is made of an electrically insulating epoxy resin.

28. The semiconductor device according to claim 1, further comprising an internal plating layer disposed in the sealing resin, wherein the internal plating layer is formed on the first terminals, the second terminals and the support terminal.

29. The semiconductor device according to claim 28, wherein the internal plating layer is made of Ag.

30. The semiconductor device according to claim 1, further comprising an external plating layer exposed from the sealing resin, wherein the external plating layer is formed on the first terminals, the second terminals and the first and second support terminals.

31. The semiconductor device according to claim 30, wherein the external plating layer is made of an alloy containing Sn.

* * * * *